United States Patent [19]
Schirmer

[11] Patent Number: 5,695,110
[45] Date of Patent: Dec. 9, 1997

[54] PROCEDURE FOR SOLDERING AN INSULATED WIRE

[75] Inventor: Klaus Schirmer, Ingolstadt, Germany

[73] Assignee: Temic Telefunken microelectronic GmbH, Heilbronn, Germany

[21] Appl. No.: 649,521

[22] Filed: May 17, 1996

[30] Foreign Application Priority Data

May 29, 1995 [DE] Germany ............... 195 18 912.4
Aug. 2, 1995 [DE] Germany ............... 195 28 315.5

[51] Int. Cl.[6] ............... B23K 1/00; H05K 3/34
[52] U.S. Cl. ............... 228/173.5; 29/839
[58] Field of Search ............... 228/173.5, 180.1, 228/136; 29/838, 839, 845

[56] References Cited

U.S. PATENT DOCUMENTS

| | | |
|---|---|---|
| 2,902,629 | 9/1959 | Little et al. . |
| 3,566,465 | 3/1971 | Weiner ............... 228/173.5 |
| 3,969,816 | 7/1976 | Swengel, Sr. et al. ............... 29/625 |
| 5,195,675 | 3/1993 | Ouden ............... 228/173.5 |

FOREIGN PATENT DOCUMENTS

| | | |
|---|---|---|
| 1828733 | 3/1961 | Germany . |
| 5-183264 | 7/1993 | Japan ............... 29/839 |
| 375051 | 3/1964 | Switzerland . |
| 811509 | 4/1959 | United Kingdom . |
| 1237853 | 6/1971 | United Kingdom . |

*Primary Examiner*—Samuel M. Heinrich
*Attorney, Agent, or Firm*—W. G. Fasse; W. F. Fasse

[57] ABSTRACT

This disclosure describes a procedure for soldering an insulated wire where the wire end features a U- or V-shaped hook with one bending point and is introduced such into the soldering hole of a printed circuit board that the bending point protrudes from the other side of the soldering hole.

2 Claims, 3 Drawing Sheets

PROCEDURE FOR SOLDERING AN INSULATED WIRE

BACKGROUND OF THE INVENTION

The invention concerns a procedure for soldering an insulated wire complete with one end stripped of all insulation inside a soldering hole of a printed circuit board comprising a drill hole as well as an electrically conductive contact surface.

Soldering procedures according to the state of the art feature a straight lead-in of the stripped end into a soldering hole of a printed circuit board as illustrated in FIG. 4 in which the reference items describe the following: an insulated wire 1 complete with a stripped end 2 which, by soldering medium (solder), is secured such in the drill hole of the soldering hole 4 of printed circuit board 3 that an electrical contact is made from wire 2 via the soldering medium (solder) to contact area 5.

Machine stripping of wires leaves notches K in the wire base material (compare FIG. 5), e.g. in copper. However, this reduces the bending elasticity of the stripped end; this applies in particular to ends tin-plated at a later stage, which also loose copper elasticity and become brittle.

In addition, when the soldering medium (solder) hardens during cooling, a sharp edge forms between soldering medium (solder) and stripped end (compare FIG. 5).

If such a state of the art soldering point is subjected to a mechanical load, which may occur as a result of being fitted into mobile equipments and vehicles (but which also may be necessary for re-adjustment purposes in the event of incorrect positioning during mounting), wire 1 will easily break at the notch or the hard edge—in particular, if this load is applied frequently.

SUMMARY OF THE INVENTION

The object of the invention is to provide a procedure for soldering an insulated wire, which avoids the above-mentioned disadvantages.

According to the invention, the stripped end of the wire will be bent into a U-shape featuring one bending point and introduced such into the soldering hole of the printed circuit board that the bending point protrudes from the other end of the soldering hole and soldering takes place on both sides of the printed circuit board, so that a part of the insulated wire area is fixedly enclosed by the soldering medium.

This procedure is advantageous as the notch is completely and fixedly enclosed by the soldering medium, and the insulated wire protrudes into the soldering medium, where it forms an edge-free transition; this produces a good bending elasticity; further advantages are that the U-shaped hook facilitates introduction of the wire, and that the U-shaped hook also features good electrical properties.

In an advantageous application of this procedure for bending- and movement-elastic fitting of components or assemblies, these can be re-adjusted with precise positioning; also, if used in mechanical load devices such as motor vehicles, any occurring forces will be absorbed by the good bending elasticity characteristics.

BRIEF DESCRIPTION OF THE DRAWINGS

This is to be explained using implementation examples with reference to the drawings below. The drawings illustrate FIG. 1 a soldering point soldered according to the above-described procedure, FIG. 2 a partial view of the transition from the insulated wire to the soldering medium according to FIG. 1, FIG. 3 a further soldering point produced by means of the procedure according to this invention, complete with notch and insulated wire enclosed in the soldering medium, FIG. 4 a soldering point produced by a state of the art procedure, FIG. 5 a partial view of the notch according to FIG. 4, and FIG. 6 a component soldered in line with the procedure according to this invention, which is bending- and movement-elastic.

DESCRIPTION OF THE PREFERRED EMBODIMENTS

Figure 1:
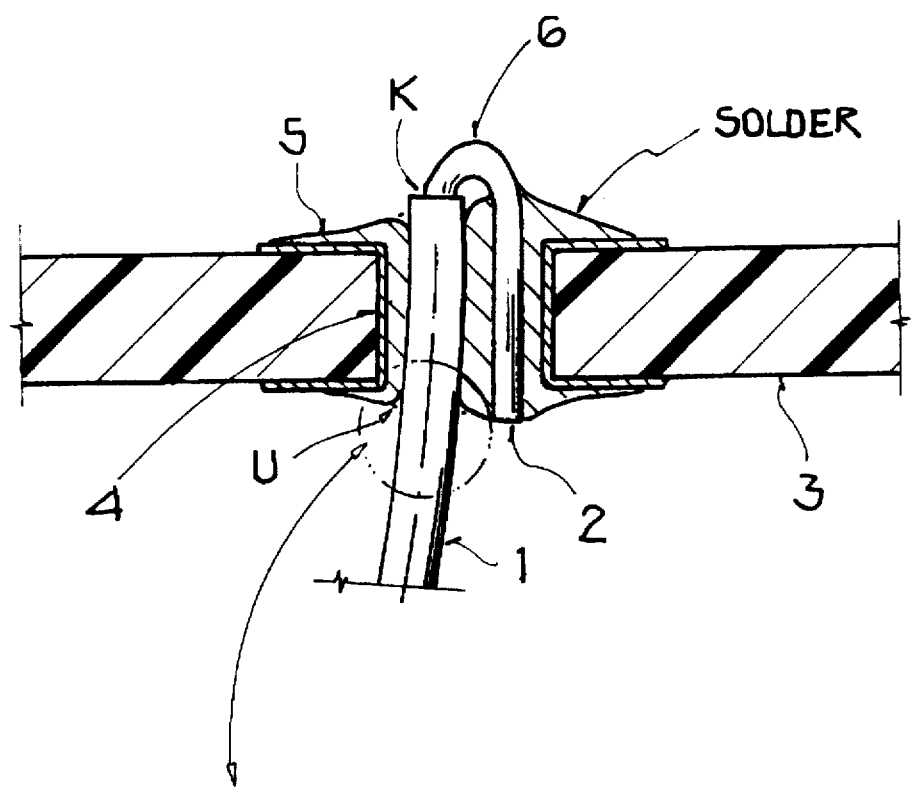
Figure 4:
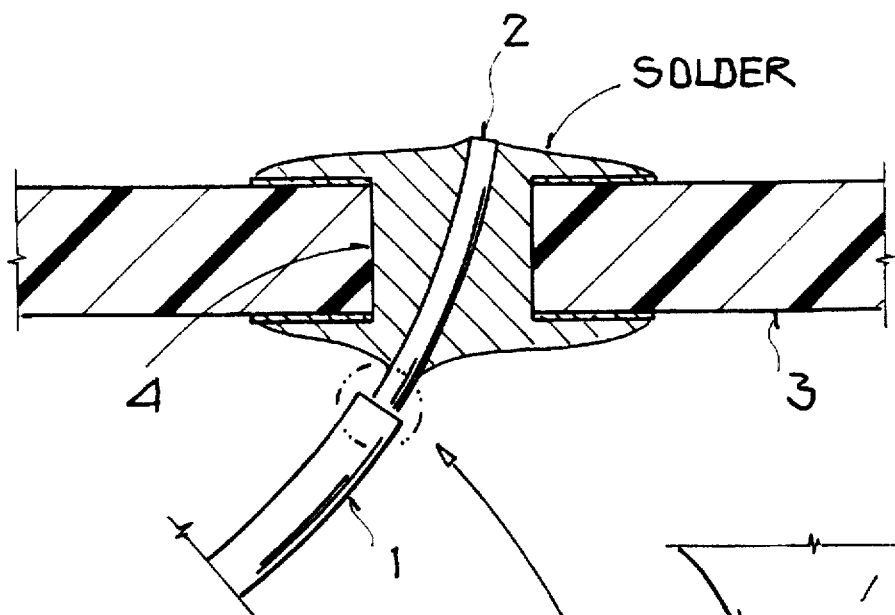
Figure 5:
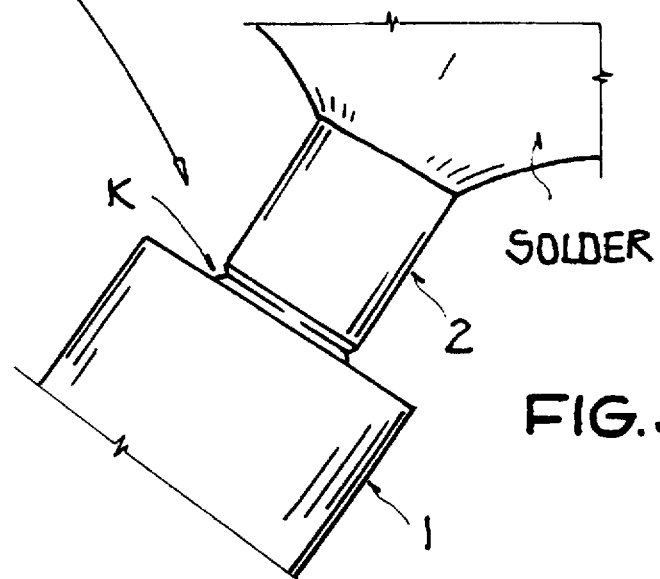

In FIG. 1, reference items 1 to 5, and analogous to the above details provided in respect of FIG. 4, a wire 1 complete with a stripped end 2 is soldered in a soldering hole 4 within a printed circuit board 3 by means of soldering medium (solder), and thus electrically connected to the contact surface 5 of a track conductor located on printed circuit board 3. The stripped end is implemented as a U-shaped hook complete with a bending point 6 and introduced into the soldering hole 4 such that the bending point 6 protrudes from this same soldering hole, and that, after soldering, the notch area K at the transition from the insulation to the stripped end of wire 2 remains free from the soldering medium (solder), as well as the immediately following area of bending point 6. However, the stripped end area 2 of wire 1 will be completely enclosed by solder.

Figure 2:
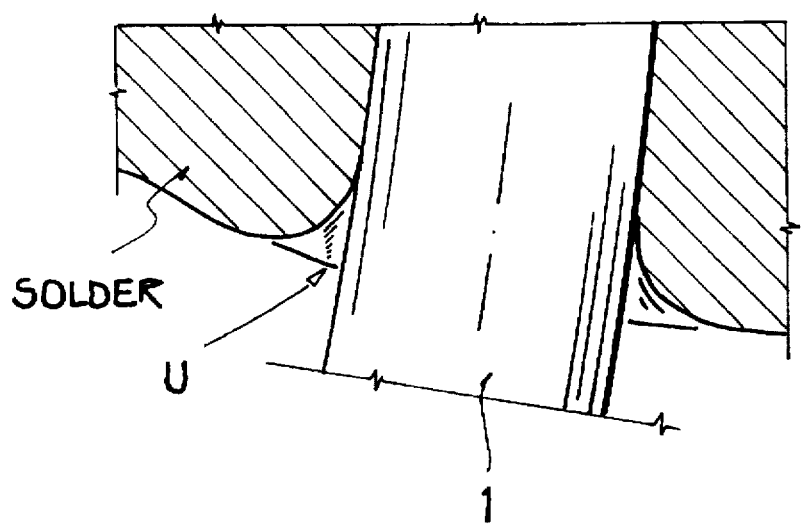

Furthermore, the insulation of wire 1 prevents a wetting effect by the liquid soldering medium during the soldering process, so that the liquid soldering medium (solder) curves toward the inside due to its surface tension, thus creating a transition Ü to wire 1 as illustrated in FIG. 2, which transition does not have any edges and therefore does not reduce the characteristic elasticity of wire 1, e.g. copper. Such a transition is also created between the insulation and the solder in the area of notch K. In this way, the solder-enclosed area of the insulation provides strain relief for wire 1 so that there is no longer any risk of the wire breaking in the area of notch K.

By means of the U-shaped hook, wire 1 is easier to introduce into soldering hole 4 as this hook has a self-adjusting effect due to its tapering shape in the area of bending point 6.

Figure 3:
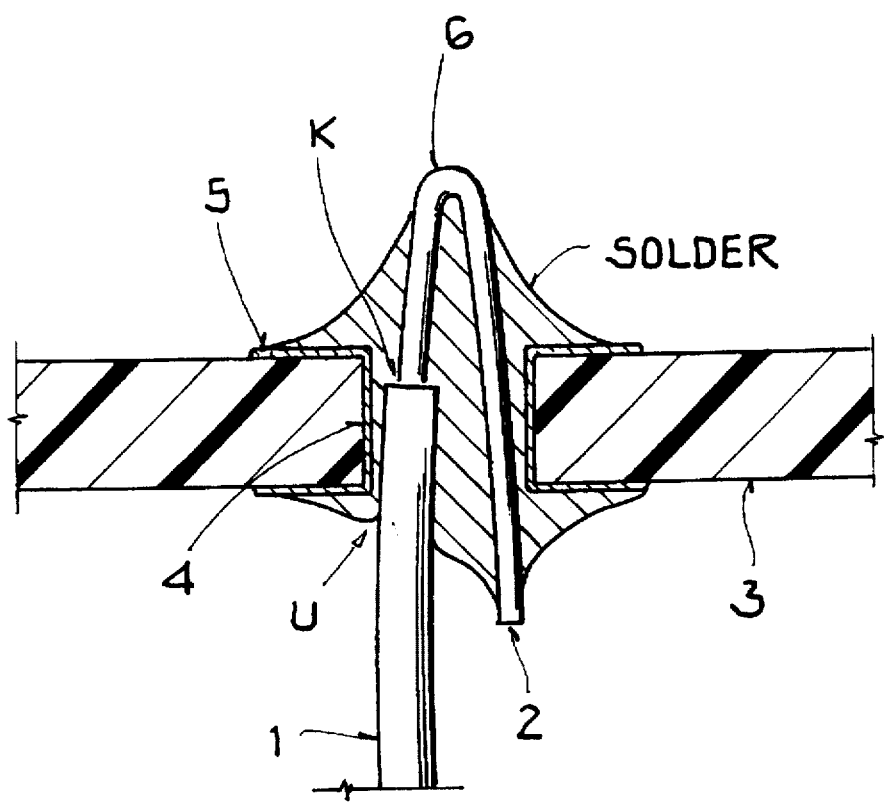

FIG. 3 shows a wire 1 soldered in a soldering hole 4; the stripped end 2 of this wire 1 is bent in a V-shape, and its bending point 6 also protrudes from soldering hole 4 as with the soldering point according to FIG. 1.

In contrast to the soldering point according to FIG. 1, notch K does not protrude from the soldering medium but will be completely enclosed by the soldering medium such that, in comparison to the implementation example according to FIG. 1, wire 1 in the area of bending point 6 is provided with an additional corrosion protection. Moreover, notch K, which also reduces the line cross-section, will be completely enclosed by an electrically conductive soldering medium (solder) so that at this point there is also no longer any risk of an electric overload occurring. Additionally, the long stripped end 2 of the wire, which end is bent as a V-shaped hook 6, provides a large electric transition surface from conductor 2 to soldering medium (solder), and thus to contact surface 5.

All that has been said in connection with FIG. 1 applies to the transition point Ü located at the trailing end of wire 1.

For the implementation examples according to FIGS. 1 and 3, the stripped end 2 of wire 1 will be tin-plated before introduction into soldering hole 4.

Figure 6:
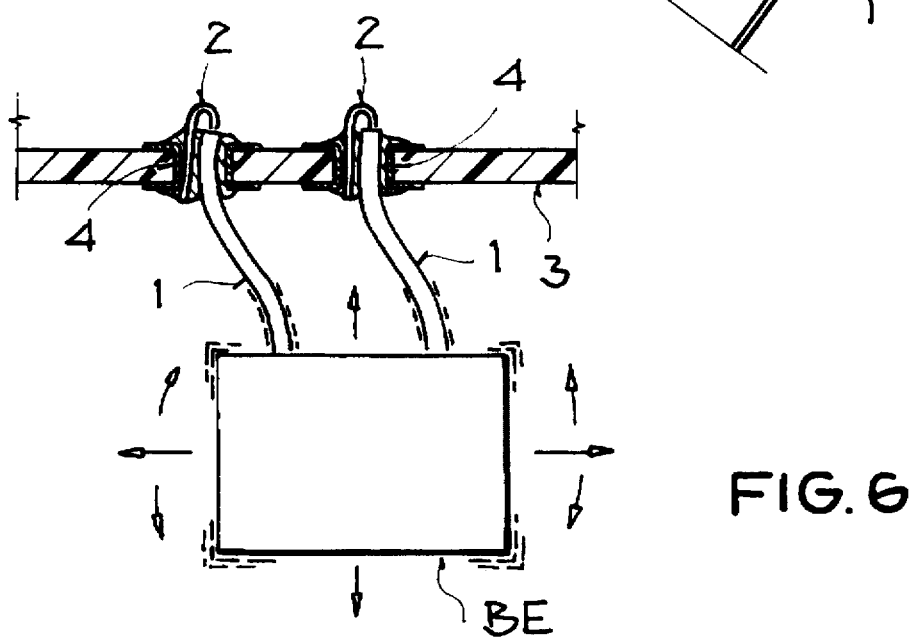

As illustrated by a final implementation example according to FIG. 6, this soldering procedure may be used to connect and mount mechanically stressed electronic components or assemblies BE in a reliable and electrically conductive way with a printed circuit board 3 such as are frequently used in vehicle engineering applications. In addition, the component or assembly BE can be readjusted to a precise position; this allows incorrect positions to be compensated.

According to FIG. 6, the component or assembly BE feature two connecting wires 1 whose wire ends are implemented as illustrated in FIG. 1. These connecting wires are each introduced into a soldering hole 4 on printed circuit board 3 and soldered on.

What is claimed is:

1. Procedure for soldering an insulated wire (1) featuring a stripped end (2) in a soldering hole (4) on a printed circuit board (3), comprising a drill hole and an electrically conductive contact surface (5), wherein the stripped end of the wire is bent as U- or V-shaped hook complete with one bending point 6 and introduced into the soldering hole (4) of the printed circuit board (3) such that bending point (6) protrudes from the other side of soldering hole (4) and soldering is effected on both sides of the printed circuit board (3) such that a portion of the insulated wire area is fixedly enclosed by the soldering medium (solder).

2. Use of the procedure according to claim 1 for bending- and movement-elastic mounting of electric components (BE) or electric assemblies (BE).

* * * * *